(12) United States Patent
Yan et al.

(10) Patent No.: US 9,368,441 B2
(45) Date of Patent: Jun. 14, 2016

(54) ELECTRONIC COMPONENT AND METHOD FOR FABRICATING THE SAME

(71) Applicant: Industrial Technology Research Institute, Chutung, Hsinchu County (TW)

(72) Inventors: Jing-Yi Yan, Chutung (TW); Wu-Wei Tsai, Chutung (TW); Wei-Cheng Kao, Chutung (TW); Wei-Han Chen, Chutung (TW)

(73) Assignee: Industrial Technology Research Institute, Chutung, Hsinchu County (TW)

( * ) Notice: Subject to any disclaimer, the term of this patent is extended or adjusted under 35 U.S.C. 154(b) by 0 days.

(21) Appl. No.: 14/560,101

(22) Filed: Dec. 4, 2014

(65) Prior Publication Data
US 2015/0348894 A1    Dec. 3, 2015

(30) Foreign Application Priority Data

May 27, 2014    (TW) .............................. 103118367 A

(51) Int. Cl.
*H01L 27/14*    (2006.01)
*H01L 23/498*    (2006.01)
*H01L 23/28*    (2006.01)
(Continued)

(52) U.S. Cl.
CPC .......... *H01L 23/49827* (2013.01); *H01L 21/56* (2013.01); *H01L 21/76801* (2013.01); *H01L 23/28* (2013.01); *H01L 23/564* (2013.01)

(58) Field of Classification Search
CPC . H01L 23/49827; H01L 23/28; H01L 23/564; H01L 21/56; H01L 21/76801
USPC ........................................ 257/40, 59, 72, 432
See application file for complete search history.

(56) References Cited

U.S. PATENT DOCUMENTS 7,943,932 B2    5/2011    Park et al.
8,179,489 B2    5/2012    Jung et al.
(Continued)

FOREIGN PATENT DOCUMENTS

TW    I376556 B    11/2012

OTHER PUBLICATIONS

Bonfiglio et al., "A completely flexible organic transistor obtained by a one-mask photolithographic process," *Appl. Phys. Letts.*, 82(20):3550-3552 (2003).
Braga and Horowitz, "High-Performance Organic Field-Effect Transistors," *Adv. Mater.* 21:1473-1486 (2009).
(Continued)

*Primary Examiner* — Tan N Tran
(74) *Attorney, Agent, or Firm* — McCarter & English, LLP; Yu Lu

(57) ABSTRACT

An electronic component and a method for fabricating the electronic component are provided. The electronic component includes a carrier, a first metal layer, a dielectric layer, a semiconductor layer, a flexible layer, at least one first opening, and at least one second metal layer. The first metal layer is disposed on the carrier. The dielectric layer is disposed on the first metal layer, and has a pattern consistent with a pattern of the dielectric layer. The semiconductor layer is disposed on the dielectric layer. The flexible layer is disposed on the carrier and encapsulates the first metal layer, the dielectric layer and the semiconductor layer. The flexible layer has a Young's modulus less than 40 GPa. The first opening penetrates the flexible layer. The second metal layer is disposed on the flexible layer and in the first opening and is electrically connected with the semiconductor layer.

12 Claims, 13 Drawing Sheets

(51) Int. Cl.
*H01L 23/00* (2006.01)
*H01L 21/56* (2006.01)
*H01L 21/768* (2006.01)

(56) References Cited

U.S. PATENT DOCUMENTS

| | | |
|---|---|---|
| 2004/0149987 A1 | 8/2004 | Kim et al. |
| 2006/0255338 A1 | 11/2006 | Jeong et al. |
| 2008/0105873 A1 | 5/2008 | Wang et al. |
| 2008/0251789 A1 | 10/2008 | Chen |
| 2010/0096654 A1 | 4/2010 | Godo |
| 2010/0270556 A1 | 10/2010 | Wang et al. |
| 2010/0283054 A1 | 11/2010 | Hirano et al. |
| 2011/0014747 A1 | 1/2011 | Lam |
| 2014/0078458 A1 | 3/2014 | Fukushima |
| 2014/0231811 A1 | 8/2014 | Yan et al. |
| 2015/0241744 A1* | 8/2015 | Nakata ............... H01L 27/0296 349/42 |

OTHER PUBLICATIONS

Jang et al., "High $T_g$ cyclic olefin copolymer/$Al_2O_3$ bilayer gate dielectrics for flexible organic complementart circuits with low-voltage and air-stable operation," *J. Mater. Chem.*, 21:12542-12546 (2011).

Seol et al., "Mechanically flexible low-leakage multilayer gate dielectrics for flexible organic thin film transistors," *Appl. Phys. Letts.*, 93:10335-1-10335-3 (2008).

Wang et al., "Low power flexible organic thin film transistors with amorphous Ba0.7Sr0.3TiO3 gate dielectric grown by pulsed laser deposition at low temperature," *Org. Electronics*, 13:1223-1228 (2012).

Yang et al., "Environmentally Stable Transparent Organic/Oxide Hybrid Transistor Based on an Oxide Semiconductor and a Polyimide Gate Insulator," *IEEE Electron Device Letts.*, 31(5):446-448 (2010).

TW I376556 English abstract.

Office Action issued Feb. 18, 2016 in TW 103118367.

Examiner's interview report issued Apr. 28, 2016 in TW103118367.

* cited by examiner

ELECTRONIC COMPONENT AND METHOD FOR FABRICATING THE SAME

CROSS-REFERENCE TO RELATED APPLICATIONS

This application claims foreign priority under 35 U.S.C. §119(a) to patent application Ser. No. 10/318,367, filed on May 27, 2014, in the Intellectual Property Office of Ministry of Economic Affairs, Republic of China (Taiwan, R.O.C.), the entire content of which Patent Application is incorporated herein by reference and made a part of this specification.

BACKGROUND OF THE INVENTION

1. Technical Field

The present disclosure relates to an electronic component and a method for fabricating the electronic component.

2. Description of Related Art

Flexible electronics or flexible displays are popular and develop rapidly in the electronic industry. Organic materials are used to form electronic components (e.g., organic semiconductors, organic dielectric layers, or organic conductive film) in order to enhance the flexibility of an electronic device. The electrical performance of organic materials is far from satisfactory as compared to inorganic materials. Hence, the organic materials do not meet the specificity requirement for the electronic product on the market. The inorganic materials are used in the fabrication of electronic components. Such fabricated electronic components have their flexibility compromised, and do not meet requirement for flexible electronic components.

SUMMARY OF THE INVENTION

An embodiment of the present disclosure provides an electronic component, comprising: a carrier; a first metal layer disposed on the carrier; a dielectric layer disposed on the first metal layer and having a pattern consistent with a pattern of the first metal layer; a semiconductor layer disposed on the dielectric layer; a flexible layer disposed on the carrier, encapsulating the first metal layer, the dielectric layer and the semiconductor layer, and having a Young's modulus less than 40 GPa; at least one first opening penetrating the flexible layer; and at least one second metal layer disposed on the flexible layer and in the first opening and electrically connected with the semiconductor layer.

An embodiment of the present disclosure further provides an electronic component, comprising: a carrier; a first metal layer disposed on the carrier; a dielectric layer disposed on the first metal layer and having a peripheral pattern consistent with a pattern of the first metal layer, wherein the dielectric layer and the first metal layer are arranged to form a plurality of disconnected patterned blocks; a flexible layer disposed on the carrier, encapsulating the first metal layer and the dielectric layer, and having a Young's modulus less than 40 GPa; at least one first opening penetrating the flexible layer and the dielectric layer; and at least one second metal layer disposed on the flexible layer and in the first opening and electrically connected with the first metal layer, wherein the second metal layer on the different patterned blocks are connected to one another.

An embodiment of the present disclosure provides a method for fabricating an electronic component, comprising: forming a first metal layer on a carrier; forming a dielectric layer on the first metal layer; forming a semiconductor layer on the dielectric layer; performing a patterning process on the first metal layer and the dielectric layer such that the first metal layer has a pattern consistent with a pattern of the dielectric layer; forming a flexible layer on the carrier that has a Young's modulus less than 40 GPa and encapsulates the first metal layer, the dielectric layer and the semiconductor layer; forming at least one first opening that penetrates the flexible layer such that a portion of the semiconductor layer is exposed from the first opening; and forming at least one second metal layer on the flexible layer and in the first opening that is electrically connected with the semiconductor layer.

BRIEF DESCRIPTION OF THE DRAWINGS

The present disclosure can be more fully understood by reading the following detailed description of the exemplary embodiments, with reference made to the accompanying drawings.

FIGS. 1A-1E are cross-sectional views illustrating a method for fabricating an electronic component in accordance with a first embodiment of the present disclosure, wherein

FIGS. 9A-9C are cross-sectional views illustrating a method for fabricating an electronic component in accordance with a ninth embodiment of the present disclosure, wherein

FIGS. 10A and 10B are cross-sectional views of an electronic component in accordance with a tenth embodiment of the present disclosure, wherein FIG. 10A is a different embodiment of FIG. 10B.

FIGS. 11A and 11B are cross-sectional views of an electronic component in accordance with an eleventh embodiment of the present disclosure, wherein FIG. 11A is a different embodiment of FIG. 11B.

DETAILED DESCRIPTION OF THE INVENTION

The present disclosure is described in the following with embodiments, so that one skilled in the art can easily understand the present disclosure.

It should be noted that all the drawings are not intended to limit the present disclosure. Various modification and variations can be made without departing from the spirit of the present disclosure. Further, terms used in the specification are merely for illustrative purpose and should not be construed to limit the scope of the present disclosure.

Figure 1A:
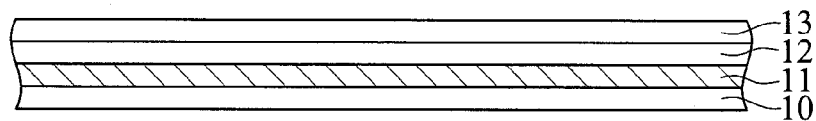
Figure 1B:
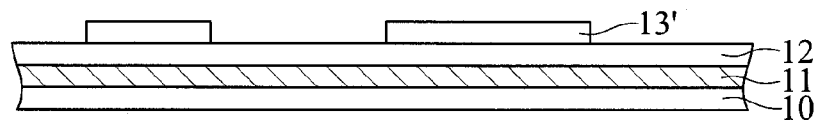
Figure 1C:
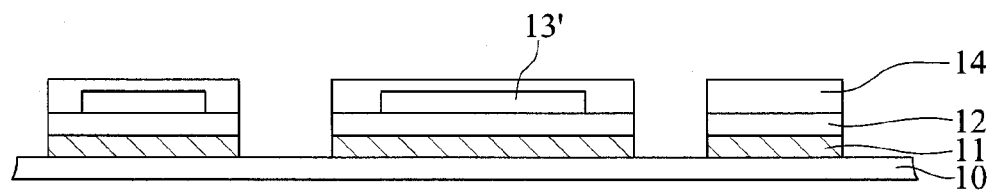
Figure 1D:
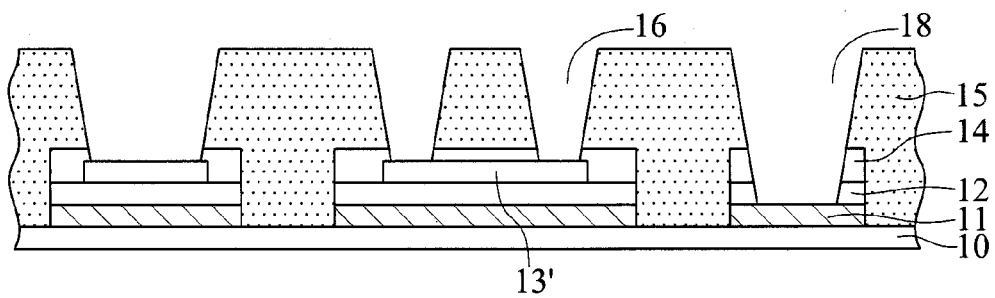
Figure 1E:
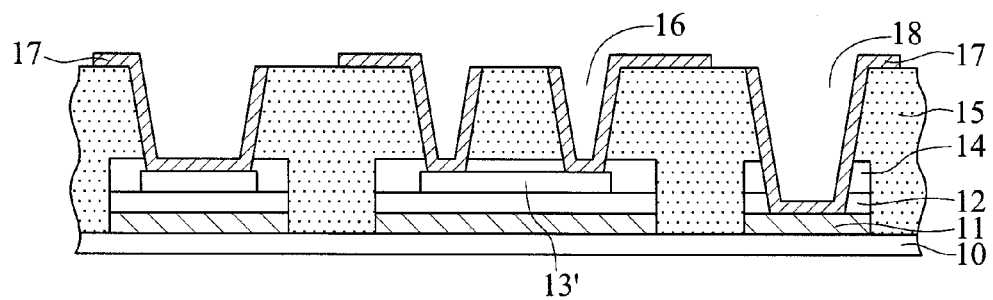
Figure 1F:
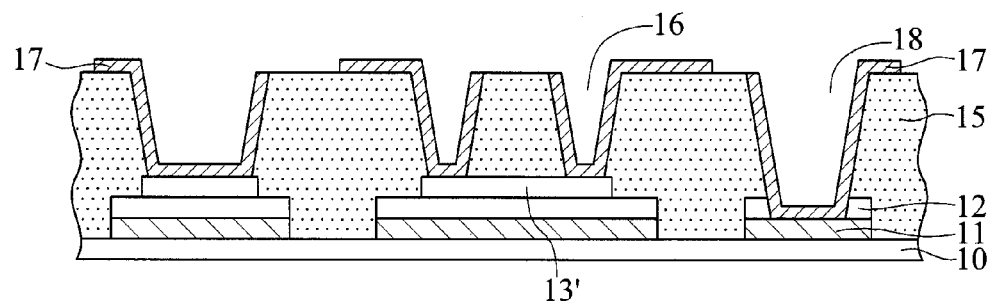
FIGS. 1F, 1G and 1H are different embodiments of FIG. 1E.
Figure 1G:
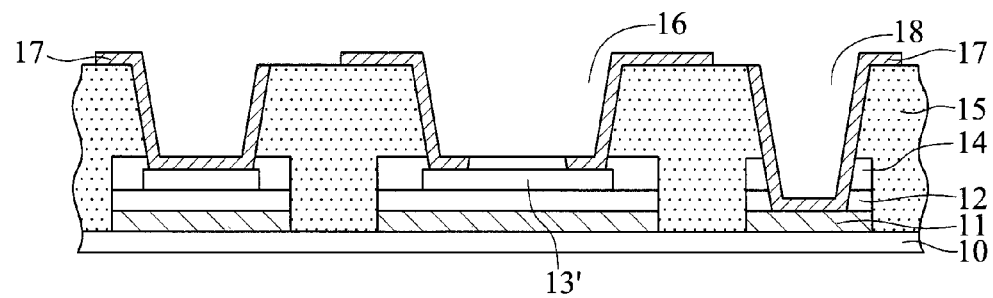
Figure 1H:
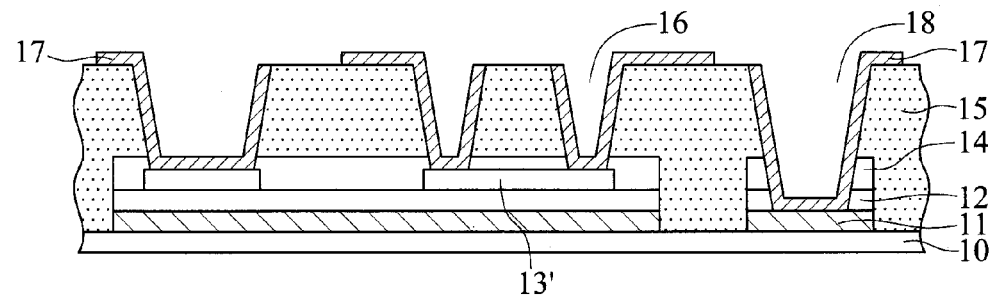

FIGS. 1A-1E are cross-sectional views illustrating a method for fabricating an electronic component in accordance with a first embodiment of the present disclosure, wherein FIGS. 1F, 1G and 1H are different embodiments of FIG. 1E. The first embodiment may be achieved within four photo engraving processes (PEP4).

As shown in FIG. 1A, a first metal layer 11 is formed on a carrier 10, a dielectric layer 12 is formed on the first metal layer 11, and a semiconductor layer 13 is formed on the dielectric layer 12. In an embodiment, the first metal layer 11 is made of a conductive material, such as Mo, Al, Ti, Cu or other alloys, or has a multi-layer stack structure formed by the materials. In an embodiment, the dielectric layer 12 is made of SiOx, SiNx, SiON or other suitable insulating materials, or has a multi-layer stack structure formed by the materials. In an embodiment, the semiconductor layer 13 is made of amorphous-Si, polycrystalline silicon or oxide semiconductor (such as InGaZnO (IGZO) system, InSnO (ITO) system, InZnO (IZO) system, InSnZnO (ITZO) system, or other semiconductor systems comprising oxygen or organic semiconductor (such as pentacene, pentacene derivatives, poly(3-hexyl thiophene), or derivatives of poly(3-hexyl thiophene), etc.).

As shown in FIG. 1B, the semiconductor layer 13 is patterned to form a semiconductor layer 13'.

As shown in FIG. 1C, a protection layer 14 is optionally formed on the dielectric layer 12 and encapsulates the semiconductor layer 13', and a patterning process is performed such that the first metal layer 11, the dielectric layer 12 and the protection layer 14 have consistent peripheral patterns. The semiconductor layer 13' may have a range smaller than a range of the first metal layer 11. The protection layer 14 protects the semiconductor layer 13' from being damaged. However, the protection layer 14 is not necessary matter. For instance, if a back channel etching (BCE) is performed subsequently, no protection layer 14 is formed; if the product has a channel protect (CHP) structure, a protection layer 14 is formed. In an embodiment, the protection layer 14 is made of oxide compounds with insulating property, nitride or carbon compound system (such as SiOx, SiNx, SiCO, AlOx, TiOx, etc.), or has a multi-layer stack structure formed by the materials.

As shown in FIG. 1D, a flexible layer 15 is formed on the carrier 10 and the protection layer 14, and encapsulates the first metal layer 11, the dielectric layer 12, and the semiconductor layer 13'. The flexible layer 15 has a Young's modulus less than 40 GPa. At least one first opening 16 is formed that penetrates the flexible layer 15 and the protection layer 14. A portion of the semiconductor layer 13' is exposed from the first opening 16. In an embodiment, the flexible layer 15 is made of an organic material system such as polyimide (PI) or the derivatives thereof, or a spin on glass (SOG) system, etc. In an embodiment, at least one second opening 18 is formed that penetrates the flexible layer 15, the protection layer 14 and the dielectric layer 12. A portion of the first metal layer 11 is exposed from the second opening 18.

As shown in FIG. 1E, at least one second metal layer 17 is formed on the flexible layer 15 and in the first opening 16 and/or the second opening 18 and electrically connected with the semiconductor layer 13' and/or the first metal layer 11. In this embodiment, for example, a capacitor is formed on the left side, a bottom-gate thin film transistor is formed in the middle portion, and a contact hole is formed on the right side. In an embodiment, the second metal layer 17 is made of a conductive material, such as Mo, Al, Ti, or Cu or the alloys thereof, or has a multi-layer stack structure formed by the materials.

Alternatively, as shown in FIG. 1F, if the subsequent process does not affect the semiconductor layer 13', it may be applicable not to form a protection layer 14, wherein the first metal layer 11 and the dielectric layer 12 have consistent patterns.

Alternatively, it may be applicable to expose the protection layer 14 on the semiconductor layer 13', as shown in FIG. 1G.

Alternatively, one or more electronic components may be encompassed in one patterned block, as shown in FIG. 1H, the capacitor and the thin film transistor may be disposed on the same patterned block. The first metal layer 11 of the capacitor and the thin film transistor as well as the dielectric layers 12 thereof are connected to one another.

Figure 2:
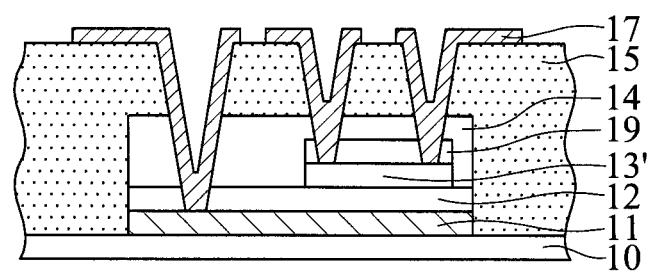
FIG. 2 is a cross-sectional view of an electronic component in accordance with a second embodiment of the present disclosure.

As shown in FIG. 2, a cross-sectional view of an electronic component in accordance with a second embodiment of the present disclosure is provided. The second embodiment differs from the first embodiment in that an additional second metal layer 17 is disposed on one side, penetrates the flexible layer 15, the protection layer 14 and dielectric layer 12, and is electrically connected with the first metal layer 11 of the thin film transistor. A semiconductor protection layer 19 is deposited or coated on the semiconductor layer 13', and has the same pattern as the semiconductor layer 13'. The semiconductor protection layer 19 protects the top surface of the semiconductor layer 13', and protects the semiconductor layer 13' from being damaged by chemicals, for example, to enhance the stability of the electronic components. Providing with the semiconductor protection layer 19 is applicable in any one of the embodiments of the present disclosure. In an embodiment, it is also applicable to not forming the protection layer 14.

FIGS. 3A-3C and FIG. 3D are cross-sectional views and a circuit diagram of an electronic component in accordance with a third embodiment of the present disclosure, respectively.

Figure 3A:
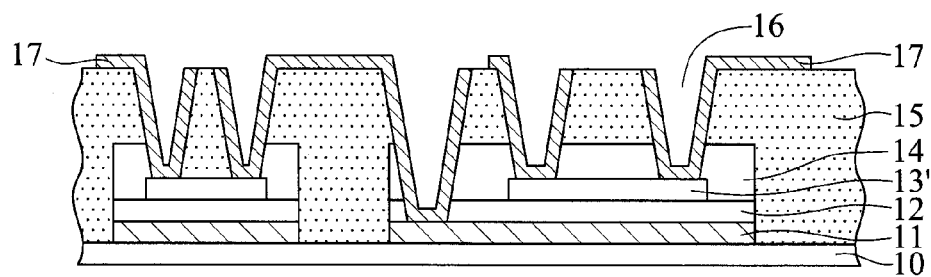
FIGS. 3A-3C and FIG. 3D are cross-sectional views and a circuit diagram of an electronic component in accordance with a third embodiment of the present disclosure, respectively.
Figure 3B:
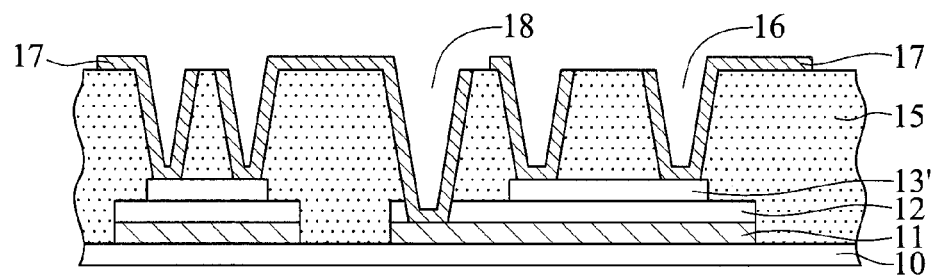
Figure 3C:
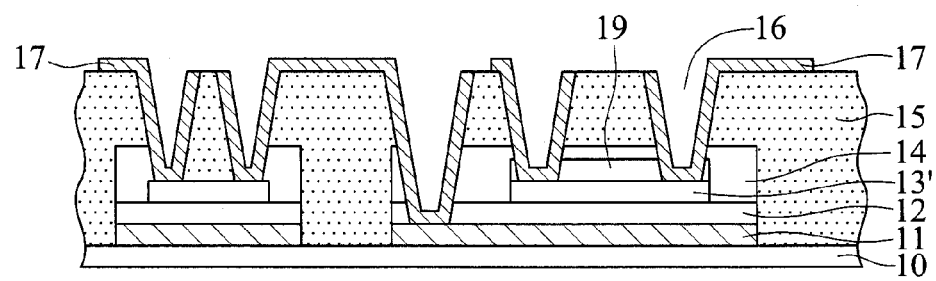
Figure 3D:
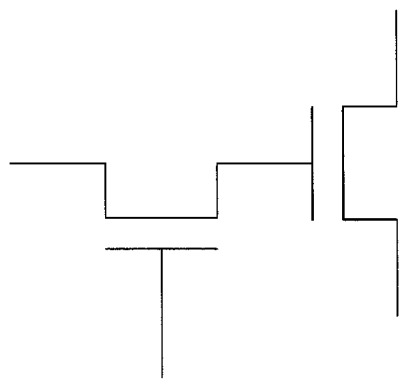

As shown in FIGS. 3A to 3C, two bottom-gate type thin film transistors are disposed on the left side and right side, respectively. The thin film transistor disposed on the left side is electrically connected with the first metal layer 11 of the thin film transistor disposed on the right side via the second metal layer 17 and the first opening 16.

In this embodiment, the first metal layer 11 (gate electrode) and the dielectric layer 12 (gate insulating layer) have identical peripheral patterns, and the semiconductor layer 13' is smaller than the first metal layer 11 (gate electrode) and the dielectric layer 12 (gate insulating layer).

The protection layer 14 optionally formed, and can be omitted, as shown in FIG. 3B. Alternatively, a semiconductor protection layer 19 may be deposited or coated on the semiconductor layer 13', as shown in FIG. 3C.

FIGS. 4A-4C and FIG. 4D are cross-sectional views and a circuit diagram of an electronic component in accordance with a fourth embodiment of the present disclosure, respectively.

Figure 4A:
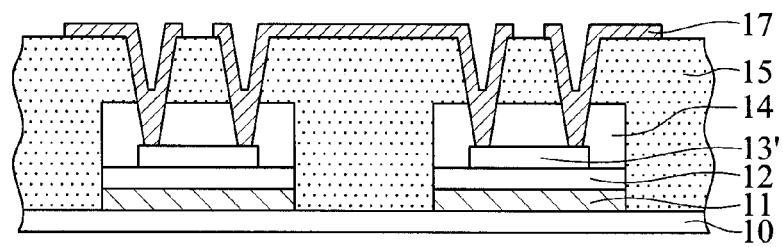
FIGS. 4A-4C and FIG. 4D are cross-sectional views and a circuit diagram of an electronic component in accordance with a fourth embodiment of the present disclosure, respectively.
Figure 4B:
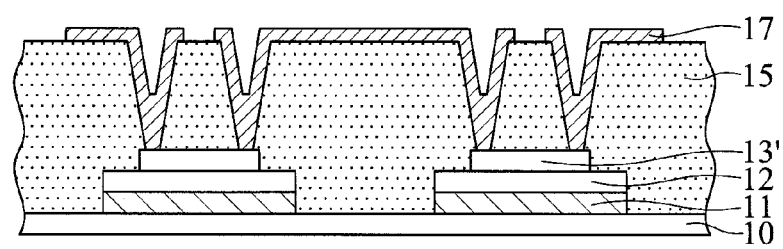
Figure 4C:
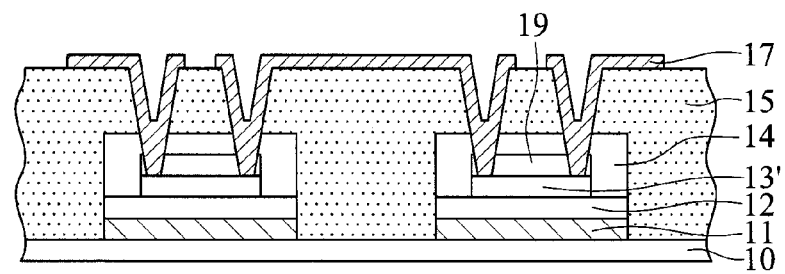
Figure 4D:
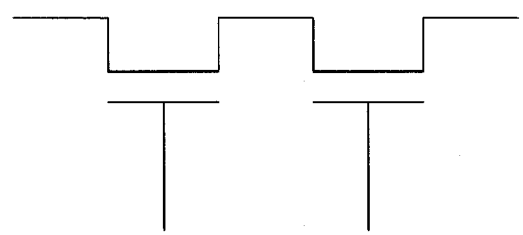

As shown in FIGS. 4A to 4C, two bottom-gate type thin film transistors are disposed on the left side and the right side, respectively. The second metal layer 17 (source electrode or drain electrode) of the thin film transistor disposed on the left side is electrically connected with the second metal layer 17 (source electrode or drain electrode) of the thin film transistor disposed on the right side.

The protection layer 14 is optionally formed, and can be omitted, as shown in FIG. 4B. The first metal layer 11 and the dielectric layer 12 have consistent patterns. Alternatively, a semiconductor protection layer 19 may be deposited or coated on the semiconductor layer 13', as shown in FIG. 4C.

Figure 5A:
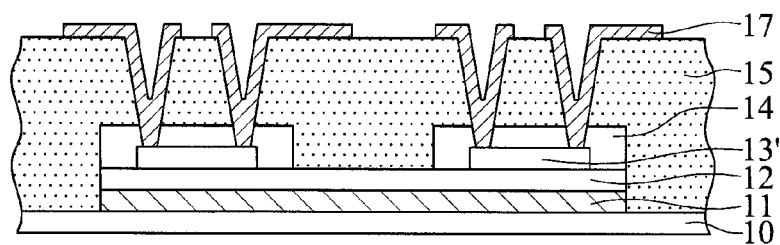
FIGS. 5A-5C and FIG. 5D are cross-sectional views and a circuit diagram of an electronic component in accordance with a fifth embodiment of the present disclosure, respectively.
Figure 5B:
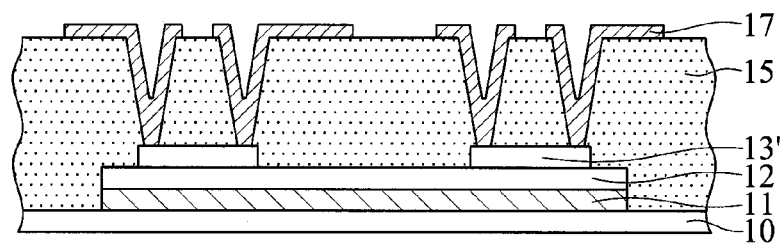
Figure 5C:
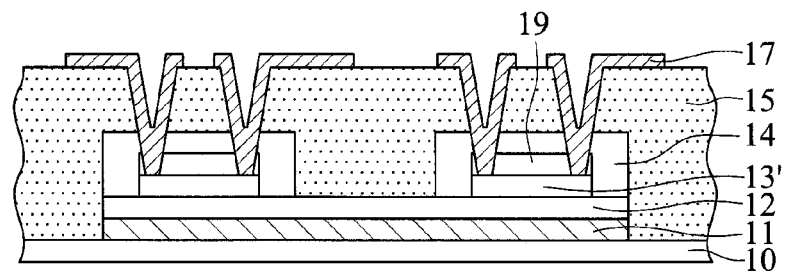
Figure 5D:
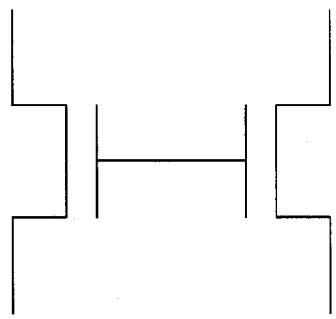

FIGS. 5A-5C and FIG. 5D are cross-sectional views and a circuit diagram of an electronic component in accordance with a fifth embodiment of the present disclosure, respectively;

As shown in FIGS. 5A to 5C, two bottom-gate type thin film transistors are disposed on the left side and the right side, respectively. The first metal layer 11 (gate electrode) and the dielectric layer 12 of the thin film transistor disposed on the left side are electrically connected with the first metal layer 11 (gate electrode) and the dielectric layer 12 of the thin film transistor disposed on the right side, respectively.

The protection layer 14 is optionally formed, and can be omitted, as shown in FIG. 4B. The first metal layer 11 and the dielectric layer 12 have consistent patterns. Alternatively, a semiconductor protection layer 19 may be deposited or coated on the semiconductor layer 13', as shown in FIG. 5C.

The structure of the foregoing embodiments may be applied for different combinations of the circuits formed by a plurality of thin film transistors, which is not limited to the examples shown in FIGS. 3A to 3D, 4A to 4D, and 5A to 5D.

FIGS. 6A-6D are cross-sectional views of an electric component in accordance with a sixth embodiment of the present disclosure.

Figure 6A:
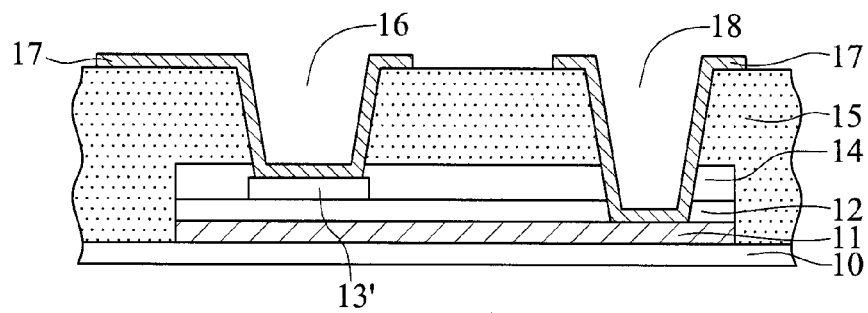
FIGS. 6A-6D are cross-sectional views of an electric component in accordance with a sixth embodiment of the present disclosure.
Figure 6B:
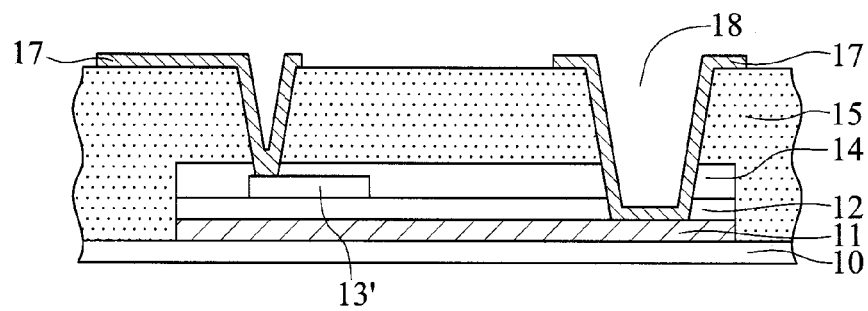
Figure 6C:
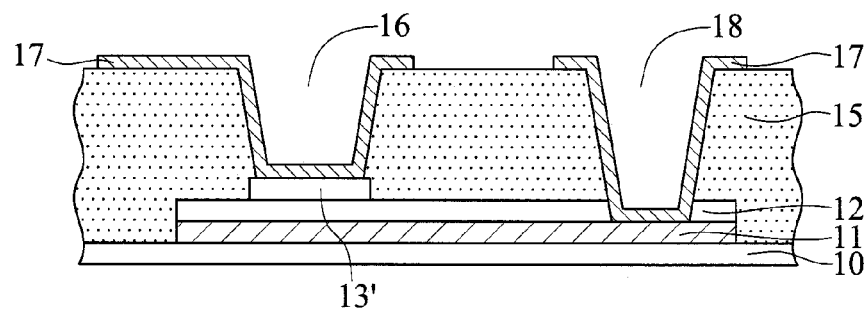
Figure 6D:
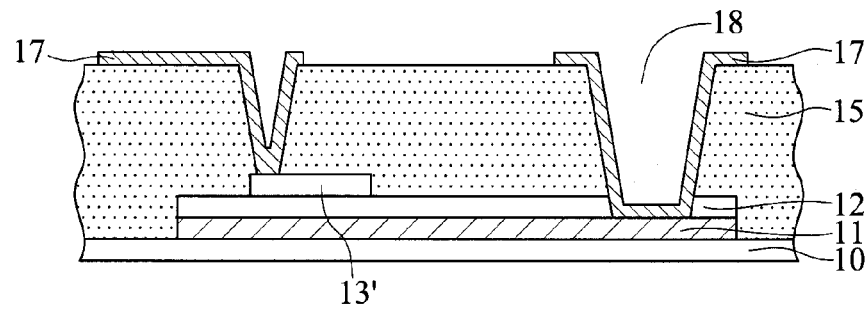

As shown in FIG. 6A to 6D, a capacitor and a contact hole are formed on the left side and the right side, respectively. The capacitor has one end electrically connected to the second metal layer 17 of the contact hole formed on the right side via the first metal layer 11 (bottom electrode), and the other end electrically connected to the semiconductor layer 13' via the second metal layer 17. The first metal layer 11 and the dielectric layer 12 have consistent peripheral patterns. The capacitance of the capacitor is determined by the contact areas of the first metal layer 11 and the second metal layer 17 with the semiconductor layer 13' via the first opening 16 or the overlapping area formed by the first metal layer 11 and the semiconductor layer 13', as shown in FIGS. 6A and 6C. The contact area between the second metal layer 17 and the semiconductor layer 13' is larger than 50% of the area of the semiconductor layer 13'. In an embodiment, the capacitance of the capacitor is determined by the contact area of the first metal layer 11 with the semiconductor layer 13', as shown in FIGS. 6B and 6D. The contact area between the second metal layer 17 and the semiconductor layer 13' is smaller than 50% of the area of the semiconductor layer 13'.

The protection layer 14 is optionally formed, and can be omitted, as shown in FIGS. 6C and 6D.

Figure 7A:
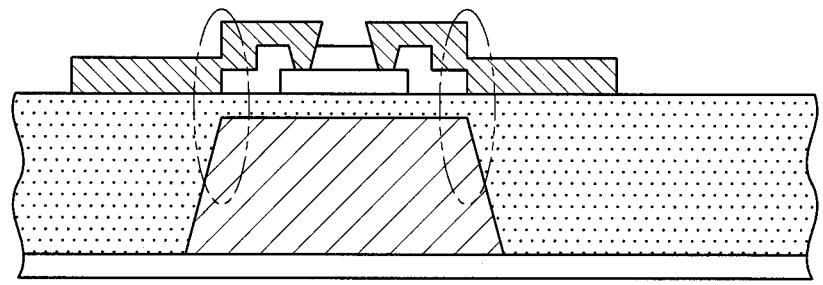
FIGS. 7A and 7B are cross-sectional views of an electronic component in a related art and an electronic component in accordance with a seventh embodiment of the present disclosure, respectively.
Figure 7B:
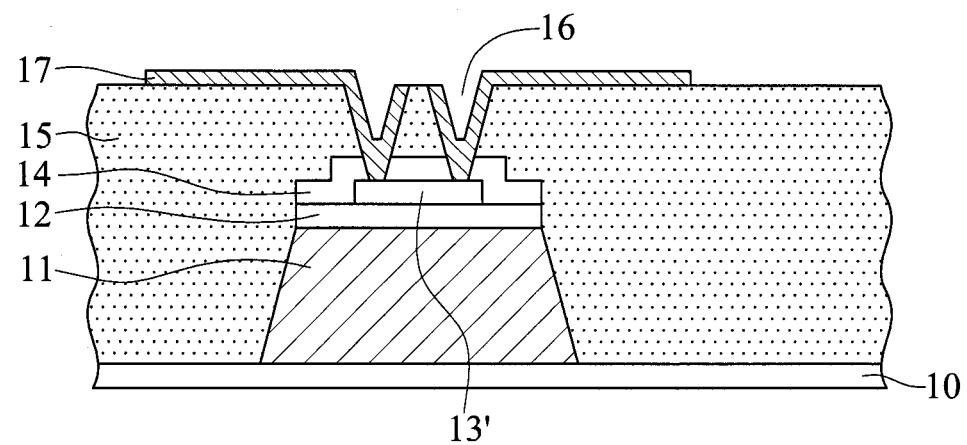

FIGS. 7A and 7B are cross-sectional views of an electronic component in a related art and an electronic component in accordance with a seventh embodiment of the present disclosure, respectively.

As shown in FIG. 7A, the thick-gate thin film transistor structure is mainly applied in large-size displays or circuits, through increasing the thickness of the gate electrode to reduce the voltage drop resulted from the resistance of the gate electrode. When incorporating thick-gate structure in the thin film transistor of a related art, the increased thickness of the gate insulating layer prevents electric leakage or defect as a result of poor cladding (shown as the dashed circle area in FIG. 7A), may cause the capacitance to be too small and require a larger capacitor area, the disposing area of the overall circuit layout is adversely affected.

As shown in FIG. 7B, the thin film transistor of the seventh embodiment is provided with a thicker (for example, more than 350 nanometers) first metal layer 11 (thick gate electrode) and a thinner (for example, less than 250 nanometers) dielectric layer 12 (gate electrode insulating layer).

The first metal layer 11 and the dielectric layer 12 may be continuously growing and patterned, and therefore do not have the problem of poor cladding. The introduced flexible layer 15 may be applied using a solution process to form a thickness larger than the thickness of the first metal layer 11, to produce a great cladding effect. The first metal layer 11 and the second metal layer 17 are separated by the flexible layer 15, the parasitic capacitance may be reduced and the resistance to electrostatic discharge (ESD) may be enhanced.

Figure 8A:
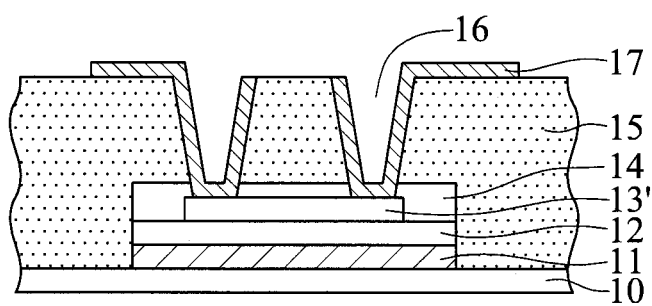
FIGS. 8A-8C are a cross-sectional view of an electronic component in accordance with an eighth embodiment of the present disclosure, a characteristic diagram of an electronic component in a related art, and a characteristic diagram of the electronic component of the embodiment, respectively.
Figure 8B:
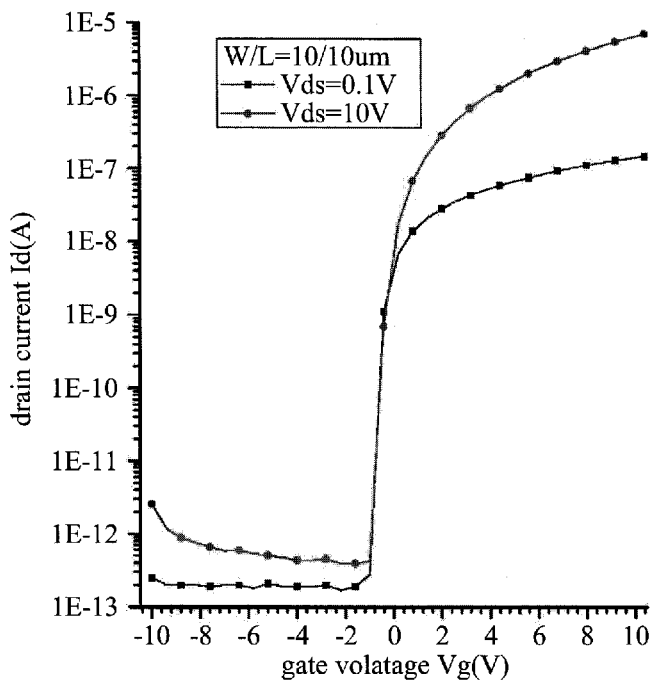
Figure 8C:
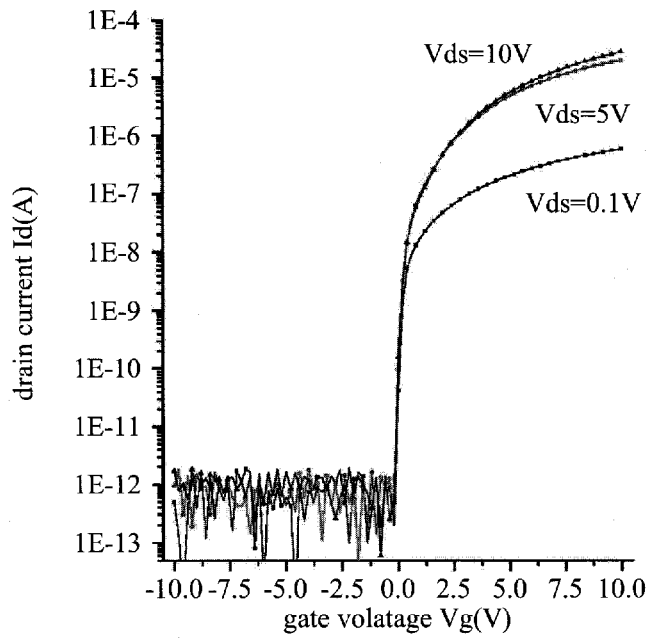

FIGS. 8A, 8B and 8C are a cross-sectional view of an electronic component in accordance with an eighth embodiment of the present disclosure, a characteristic diagram of an electronic component in a related art, and a characteristic diagram of the electronic component of the present disclosure, respectively.

In FIGS. 8B and 8C, apart from the incorporated patterning structure and flexible layer 15 in the thin film transistor of FIG. 8C, the remaining conditions are identical. The characteristics of the two components are shown in Table 1. The thin film transistor provided by this embodiment of the present disclosure not only can be practically implemented, but the characteristics thereof compared to the electronic component in a related art are improved.

TABLE 1

|  | Off current (A) | threshold voltage (V) | subthreshold swing (V/dec.) | carrier mobility (cm$^2$/Vs) |
|---|---|---|---|---|
| the present disclosure | ~pA | 0.15 | 0.19 | 13.1 |
| related art | <pA | −0.3 | 0.18 | 12.7 |

Figure 9A:
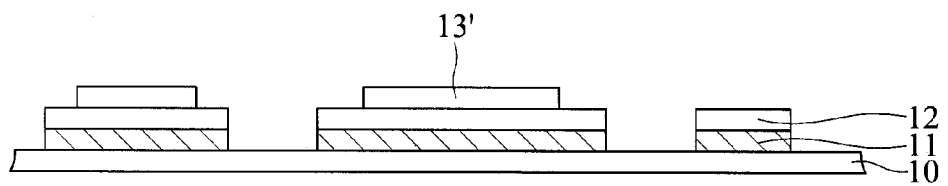
Figure 9B:
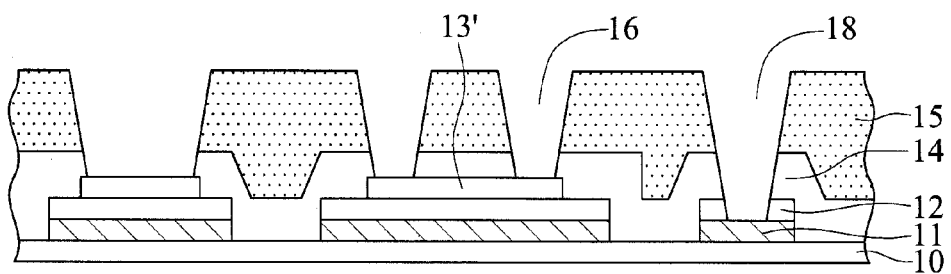
Figure 9C:
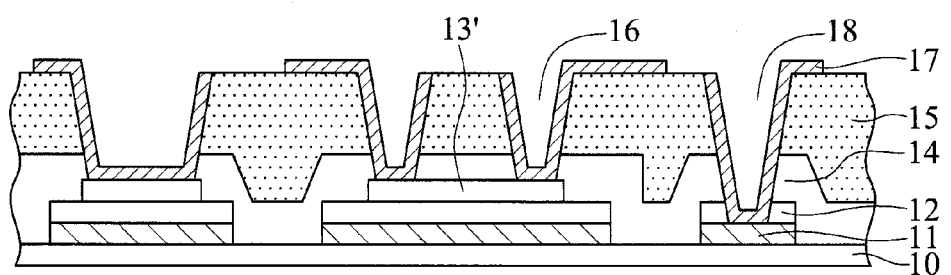
Figure 9D:
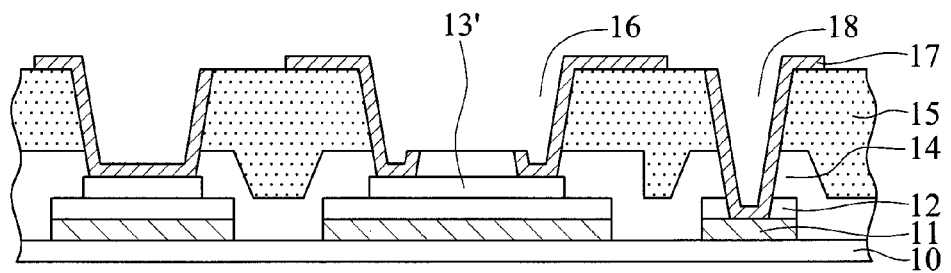
FIG. 9D shows a different embodiment of FIG. 9C.

FIGS. 9A-9C are cross-sectional views illustrating a method for fabricating an electronic component in accordance with a ninth embodiment of the present disclosure, wherein FIG. 9D shows a different embodiment of FIG. 9C.

As shown in FIG. 9A, a first metal layer 11 is formed on a carrier 10, a dielectric layer 12 is formed on the first metal layer 11, a patterning process is performed such that the first metal layer 11 and the dielectric layer 12 have consistent patterns, and a semiconductor layer 13' is formed on the dielectric layer 12.

As shown in FIG. 9B, a protection layer 14 is formed on the carrier 10 and encapsulates the first metal layer 11, the dielectric layer 12 and a portion of the semiconductor layer 13', and a flexible layer 15 is formed on the protection layer 14, and at least one first opening 16 is formed and penetrates the flexible layer 15 and the protection layer 14. In an embodiment, at least one second opening 18 is formed and penetrates the flexible layer 15, the protection layer 14 and the dielectric layer 12.

As shown in FIG. 9C, at least one second metal layer 17 is formed on the flexible layer 15 and in the first opening 16 and/or in the second opening 18, and electrically connected with the semiconductor layer 13' and/or the first metal layer 11. A capacitor is formed on the left side, a bottom-gate type thin film transistor is formed in the middle portion, and a contact hole is formed on the right side. The rest of details can be extrapolated from the foregoing first embodiment, and will not be described herein.

Alternatively, a patterning process may be performed on the flexible layer 15 to expose the protection layer 14 on the semiconductor layer 13', as shown in FIG. 9D.

Figure 10A:
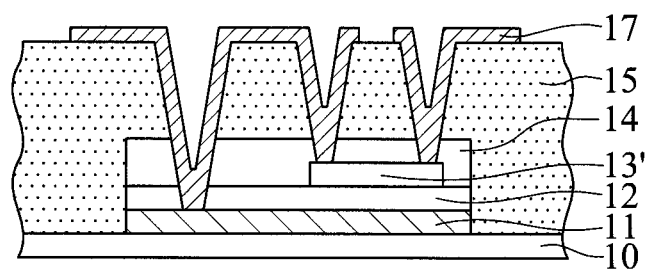
Figure 10B:
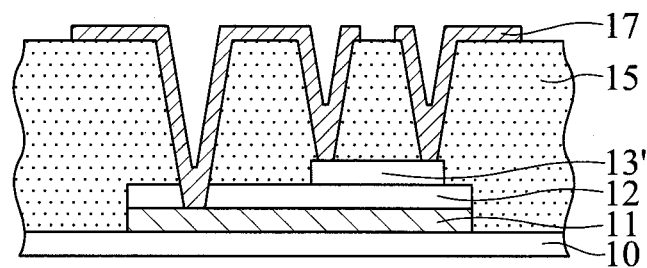

FIGS. 10A and 10B are cross-sectional views of an electronic component in accordance with a tenth embodiment of the present disclosure, wherein FIG. 1 OA is a different embodiment of FIG. 10B.

As shown in FIG. 10A, a second metal layer 17 is electrically connected to the first metal layer 11 and semiconductor layer 13' to form a diode.

As shown in FIG. 10B, it is also applicable not to form a protection layer 14.

Figure 11A:
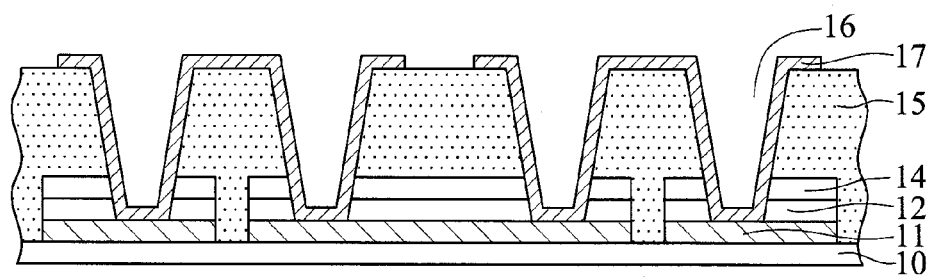
Figure 11B:
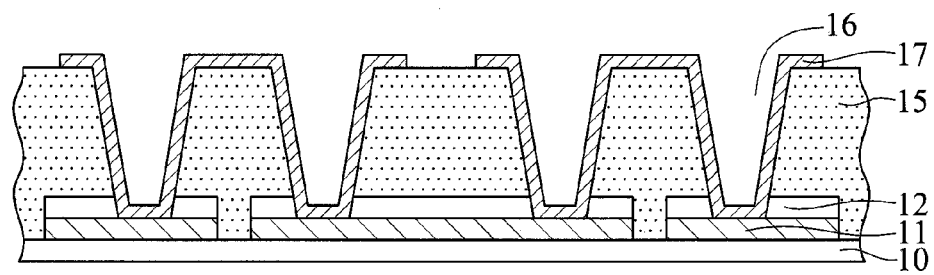

FIGS. 11A and 11B are cross-sectional views of an electronic component in accordance with an eleventh embodiment of the present disclosure, wherein FIG. 11A is a different embodiment of FIG. 11B.

As shown in FIG. 11B, an electronic component, such as a resistor or an antenna, is provided, and comprises: a carrier 10; a first metal layer 11 disposed on the carrier 10; a dielectric layer 12 disposed on the first metal layer 11 and having a peripheral pattern consistent with a peripheral pattern of the first metal layer 11, wherein the first metal layer 11 and the dielectric layer 12 are arranged to form a plurality of disconnected patterned blocks; a flexible layer 15 disposed on the carrier 10, encapsulating the first metal layer 11 and the dielectric layer 12, and having a Young's modulus less than 40 GPa; at least one first opening 16 penetrating the flexible layer 15 and the dielectric layer 12; and at least one second metal layer 17 disposed on the flexible layer 15 and in the first opening 16 and electrically connected with the first metal layer 11, wherein the second metal layer 17 disposed on the different patterned blocks are coupled to one another.

In FIG. 11A, a protection layer 14 is further disposed on the dielectric layer 12. The protection layer 14 and the dielectric layer 12 have consistent peripheral patterns, and the first opening 16 further penetrates the protection layer 14.

Referring to FIGS. 1E, 1F, 1G, 1H, 2, 3A-3C, 4A-4C, 5A-5C, 6A-6D, 7B, 8A, 9C, 9D, 10A and 10B. The embodiment of the present disclosure provides an electronic component, comprising: a carrier 10; a first metal layer 11 disposed on the carrier 10; a dielectric layer 12 disposed on the first metal layer 11 and having a peripheral pattern consistent with a peripheral pattern of the first metal layer 11; a semiconductor layer 13' disposed on the dielectric layer 12; a flexible layer 15 disposed on the carrier 10, encapsulating the first metal layer 11, the dielectric layer 12, and the semiconductor layer 13', and having a Young's modulus less than 40 GPa; at least one first opening 16 penetrating the flexible layer 15; and at least one second metal layer 17 disposed on the flexible layer 15 and in the first opening 16 and electrically connected with the semiconductor layer 13'.

In an embodiment, the range of the semiconductor layer 13' may be smaller than the range of the first metal layer 11, and/or a protection layer 14 may be disposed on the dielectric layer 12 and encapsulates the semiconductor layer 13'. The protection layer 14 and the dielectric layer 12 have consistent peripheral patterns, and the first opening 16 further penetrates the protection layer 14.

In an embodiment, a protection layer 14 is further disposed on the carrier 10 and encapsulates the dielectric layer 12, the semiconductor layer 13' and the first metal layer 11, and the first opening 16 further penetrates the protection layer 14.

In an embodiment, a semiconductor protection layer 19 is further disposed on the semiconductor layer 13'. The semiconductor protection layer 19 and the semiconductor layer 13' have consistent patterns, and the first opening 16 further penetrates the semiconductor protection layer 19.

Referring to FIGS. 11A and 11B, the embodiment of the present disclosure provides an electronic component, comprising: a carrier 10; a first metal layer 11 disposed on the carrier 10; a dielectric layer 12 disposed on the first metal layer 11 and having a peripheral pattern consistent with a peripheral pattern of the first metal layer 11, wherein the first metal layer 11 and the dielectric layer 12 are arranged to form a plurality of isolated patterned blocks; a flexible layer 15 disposed on the carrier 10, encapsulating the first metal layer 11 and the dielectric layer 12, and having a Young's modulus less than 40 GPa; at least one first opening 16 penetrating the flexible layer 15 and the dielectric layer 12; at least one first opening 16 penetrating the flexible layer 15 and the dielectric layer 12; and at least one second metal layer 17 disposed on the flexible layer 15 and in the first opening 16, and electrically connected with the first metal layer 11, wherein the second metal layers 17 disposed on the different pattern blocks are coupled to one another.

In an embodiment, the electronic components comprise thin film transistors, capacitors, resistors, inductors, contact holes, diodes, memories, or antennas. The relationship of how the components are coupled to the others may be modified according to practical needs, and is not limited to the above mentioned method.

One embodiment of the present disclosure provides a flexible layer made of a flexible material such as organic material to isolate and encapsulate the electronic components, such as thin film transistors, capacitors or contact holes, to disperse the stress and increase stress absorption, such that the electronic components provided by the embodiments of the present disclosure have a better flexibility. Furthermore, since parts of the electronic component are made by inorganic materials, the electrical performance may be kept in optimum condition; as reduce the number of patterning processes, the manufacturing time and cost maybe effectively saved.

The present disclosure has been described using exemplary embodiments. However, it is to be understood that the scope of the present disclosure is not limited to the disclosed embodiments. On the contrary, it is intended to cover various modifications and similar arrangements. The scope of the claims, therefore, should be accorded the broadest interpretation so as to encompass all such modifications and similar arrangements.

The invention claimed is:

1. An electronic component, comprising:
    a carrier;
    a first metal layer disposed on the carrier;
    a dielectric layer disposed on the first metal layer, the dielectric layer having a pattern and not being directly in contact with the carrier;
    a semiconductor layer disposed on the dielectric layer;
    a flexible layer disposed on the carrier, the flexible layer being directly in contact with a side wall surface of the first metal layer and encapsulating the first metal layer, the dielectric layer and the semiconductor layer, and having a Young's modulus less than 40 GPa;
    at least one first opening penetrating the flexible layer; and
    at least one second metal layer disposed on the flexible layer and in the first opening and electrically connected with the semiconductor layer.

2. The electronic component of claim 1, wherein the semiconductor layer has a range smaller than a range of the first metal layer.

3. The electronic component of claim 1, further comprising a protection layer disposed on the dielectric layer, encapsulating the semiconductor layer, and having a periphery pattern consistent with a periphery pattern of the dielectric layer, wherein the first opening further penetrates the protection layer.

4. The electronic component of claim 1, further comprising a protection layer disposed on the carrier and encapsulating the dielectric layer, the semiconductor layer and the first metal layer, wherein the first opening further penetrates the protection layer.

5. The electronic component of claim 1, wherein the first metal layer has a thickness greater than 350 nanometers.

6. The electronic component of claim 1, further comprising a second opening formed in a region where the semiconductor layer is not disposed, and penetrating the flexible layer and the dielectric layer, wherein the second metal layer is further disposed in the second opening and electrically connected with the first metal layer to form a contact hole.

7. The electronic component of claim 6, wherein having a plurality of electronic components, and one of the second metal layers of the electronic components is electrically connected with the first metal layer or the second metal layer of the other one of the electronic components, or the first metal layers of the electronic components are connected to one another and the dielectric layers of the electronic components are connected to one another.

8. The electronic component of claim 7, further comprising a protection layer disposed on the dielectric layer and encapsulating the semiconductor layer, wherein the first opening further penetrates the protection layer.

9. The electronic component of claim 1, wherein the second metal layer is electrically connected to the first metal layer and the semiconductor layer.

10. The electronic component of claim 1, further comprising a semiconductor protection layer disposed on the semiconductor layer and having a pattern consistent with a pattern of the semiconductor layer, wherein the first opening further penetrates the semiconductor protection layer.

11. An electronic component, comprising:
a carrier;
a first metal layer disposed on the carrier;
a dielectric layer disposed on the first metal layer and having a peripheral pattern consistent with a pattern of the first metal layer, wherein the dielectric layer and the first metal layer are arranged to form a plurality of disconnected patterned blocks;
a flexible layer disposed on the carrier and encapsulating the first metal layer and the dielectric layer, and having a Young's modulus less than 40 GPa;
at least one first opening penetrating the flexible layer and the dielectric layer; and
at least one second metal layer disposed on the flexible layer and in the first opening and electrically connected with the first metal layer, wherein the second metal layer on the different patterned blocks are connected to one another.

12. The electronic component of claim 11, further comprising a protection layer disposed on the dielectric layer and having a peripheral pattern consistent with a peripheral pattern of the dielectric layer, wherein the first opening further penetrates the protection layer.

* * * * *